United States Patent
Fessler et al.

(10) Patent No.: US 11,988,557 B2
(45) Date of Patent: May 21, 2024

(54) ELECTRIC FIELD DETECTION METHOD AND SYSTEM

(71) Applicant: BATTELLE SAVANNAH RIVER ALLIANCE, LLC, Aiken, SC (US)

(72) Inventors: Kimberly Alicia Strange Fessler, Aiken, SC (US); Steven Michael Serkiz, Aiken, SC (US)

(73) Assignee: Battelle Savannah River Alliance, LLC, Aiken, SC (US)

( * ) Notice: Subject to any disclaimer, the term of this patent is extended or adjusted under 35 U.S.C. 154(b) by 87 days.

(21) Appl. No.: 17/545,106

(22) Filed: Dec. 8, 2021

(65) Prior Publication Data

US 2023/0175891 A1 Jun. 8, 2023

(51) Int. Cl.
*G01J 3/44* (2006.01)
*G01J 3/02* (2006.01)
*G01J 3/10* (2006.01)
*G01N 21/65* (2006.01)

(52) U.S. Cl.
CPC . *G01J 3/44* (2013.01); *G01J 3/10* (2013.01); *G01N 21/65* (2013.01); *G01J 3/0218* (2013.01)

(58) Field of Classification Search
CPC combination set(s) only.
See application file for complete search history.

(56) References Cited

U.S. PATENT DOCUMENTS

| | | | |
|---|---|---|---|
| 5,455,417 A * | 10/1995 | Sacristan | G01N 27/622 250/282 |
| 7,214,298 B2 * | 5/2007 | Spence | G01N 15/14 204/600 |
| 7,615,762 B2 * | 11/2009 | Satyanarayana | B03C 5/026 250/461.2 |
| 8,097,141 B2 | 7/2012 | Schmidt et al. | |
| 8,400,639 B2 | 3/2013 | Vollmer et al. | |
| 8,524,063 B2 | 9/2013 | Hughes et al. | |
| 8,674,306 B2 | 3/2014 | Falk et al. | |
| 8,961,762 B2 | 2/2015 | Ihara et al. | |
| 9,182,338 B2 | 11/2015 | Chou et al. | |
| 9,387,488 B2 | 7/2016 | Chou et al. | |

(Continued)

FOREIGN PATENT DOCUMENTS

WO WO 2014/036915 3/2014

OTHER PUBLICATIONS

Li, Weiwei, et al. "Reduced graphene oxide electrically contacted graphene sensor for highly sensitive nitric oxide detection." ACS nano 5.9 (2011): 6955-6961 (Year: 2011).*

(Continued)

*Primary Examiner* — Tarifur R Chowdhury
*Assistant Examiner* — Roberto Fabian, Jr.
(74) *Attorney, Agent, or Firm* — Dority & Manning, P.A.

(57) ABSTRACT

Methods and systems are described for use in determination of the presence, type (static or AC), direction, and/or strength of an electric field. Methods include examination of a gaseous sample to determine the presence of perturbation effects brought about by dielectrophoretic forces acting on components of the gaseous sample, and thereby, to identify the presence of an electric field. Examination of a gaseous sample can include Raman spectroscopy. A gaseous sample can be analyzed to determine the presence of molecular polarization due to an induced dipole on a polarizable molecule.

19 Claims, 4 Drawing Sheets

(56) References Cited

U.S. PATENT DOCUMENTS

| | | | |
|---|---|---|---|
| 9,518,956 | B2 | 12/2016 | Chung et al. |
| 9,778,400 | B2 | 10/2017 | Ndukaife et al. |
| 9,915,614 | B2 | 3/2018 | Chou et al. |
| 10,024,819 | B2 | 7/2018 | Lo et al. |
| 2007/0147728 | A1* | 6/2007 | Schmidt ............ G01N 21/05 385/14 |
| 2008/0258071 | A1* | 10/2008 | Arnold ............ G01N 21/6402 250/373 |
| 2011/0100820 | A1 | 5/2011 | Bachmann et al. |
| 2012/0282594 | A1 | 11/2012 | Chen et al. |
| 2014/0209463 | A1 | 7/2014 | Gibson et al. |
| 2019/0126276 | A1 | 5/2019 | Ward et al. |
| 2019/0170652 | A1 | 6/2019 | Dies et al. |
| 2019/0234902 | A1 | 8/2019 | Lima, Jr. et al. |
| 2019/0374944 | A1* | 12/2019 | Lundquist ............ G01J 3/4406 |

OTHER PUBLICATIONS

Olariu, M. et al. "Methane and Hydrogen Gas Sensing Properties of Fullerenes C60 for Breath Analyzing Purposes." (2018) (Year: 2018).*

Salemmilani, R., et al. "Dielectrophoretic nanoparticle aggregation for on-demand surface enhanced Raman spectroscopy analysis." Analytical chemistry 90.13 (2018): 7930-7936 (Year: 2018).*

Cheng, I-Fang, et al. "Rapid (< 5 min) identification of pathogen in human blood by electrokinetic concentration and surface-enhanced Raman spectroscopy." Scientific reports 3.1 (2013): 2365 (Year: 2013).*

Aussenegg, et al. "Measurement of Raman scattering in simple liquids under the influence of high quasi-static electric fields" *Phys. Lett.* 68A (1978) pp. 194-196.

Aussenegg, et al. "Measurement of Raman scattering in high field electric strength" *Phys. Lett.* 50A (1974) pp. 233-234.

Barik, et al. "Dielectrophoresis-Enhanced Plasmonic Sensing with Gold Nanohole Arrays" *Nano Lett.* 14 (2014) pp. 2006-2012.

Barzan, et al. "Combining Raman Spectroscopy and Dielectrophoresis for rapid determination of bacterial antibiotic susceptibility" *BIPM* P30 (2020) p. 1.

Brown, et al. "Electric Field Guided Assembly of One-Dimensional Nanostructures for High Performance Sensors" *Sensors* 12 (2012) pp. 5725-5751.

Chapkin, et al. "Real-time assessment of carbon nanotube alignment in a polymer matrix under an applied electric field via polarized Raman spectroscopy" *Polymer Test.* 56 (2016) pp. 29-35.

Chrimes, et al. "Dielectrophoresis-Raman spectroscopy system for analysing suspended nanoparticles" *Lab Chip* 11 (2011) pp. 921-928.

Damen, et al. "Raman effect in zinc oxide" *Phys. Rev.* 142 (1966) pp. 570-574.

Deng, et al. "Electrokinetic trapping and surface enhanced Raman scattering detection of biomolecules using optofluidic device integrated with a microneedles array" *Biomicrofluidics* 7:014111 (2013) pp. 1-9.

Kiel, et al. "Inelastic electron tunneling spectroscopy: A review of an emerging analytical technique" *Appl. Spec.* 30 (1976) pp. 1-18.

Liao, et al. "Fast and sensitive detection of bacteria from a water droplet by means of electric field effects and micro-Raman spectroscopy" *Sens. Bio-Sens. Res.* 6 (2015) pp. 59-66.

Liu, et al. "Dielectrophoretic Assembly of Nanowires" *J. Phys. Chem. B* 110 (2006) pp. 14098-14106.

Moore, et al. "Portable Raman explosives detection" *Anal. Bioanal. Chem.* 393 (2009) pp. 1571-1578.

Oliveira, et al. "Directed-assembly of carbon structures in a nonpolar dielectric liquid under the influence of DC-generated electric fields" *Carbon* 93 (2014) pp. 32-38.

Rowell, et al. "Rayleigh-Raman depolarization of laser light scattered by gases" *J. Chem. Phys.* 54 (1971) pp. 1960-1964.

Sano, et al. "Simultaneous electrokinetic flow and dielectrophoretic trapping using perpendicular static and dynamic electric fields" *Microfluid Nanofluid* 15 (2013) pp. 599-609.

Wisseroth, et al. "Thermodynamic equilibrium in strong electric fields and field chemistry consequences" *J. Physique* 38 (1977) pp. 1249-1255.

* cited by examiner

ELECTRIC FIELD DETECTION METHOD AND SYSTEM

FEDERAL RESEARCH STATEMENT

This invention was made with Government support under Contract No. DE-AC09-08SR22470, awarded by the United States Department of Energy. The Government has certain rights in the invention.

BACKGROUND

Various methods for detection of electric fields are known and widely used to determine electric field type (e.g., static or alternating, uniform or nonuniform), direction, and/or intensity in a given location. What is believed to be the oldest electric field detector for measurement of static electric fields, the gold leaf electrometer, has been used for centuries. The gold leaf electrometer—and the later-developed capacitive-type electrostatic voltmeter—depend on forces produced by the charge gradient to operate. Other static field detectors known in the art depend on the vibrating reed principle. In addition to such relatively low field strength detectors, devices are known that are used for warning of the presence of strong electrical fields such as those around high-voltage lines. Since the fields created by high voltage lines are usually quite strong when they are closely approached, these warning devices do not require great sensitivity. Unfortunately, while current static electric field detection devices work well for relatively strong fields, they are not as effective for detection of low strength fields or detection at distance. In fact, current static electric field detection devices require the sensor to be within a few millimeters of the highest field strength of the field for detection. As such, in order to determine the presence of a static electric field within a less-than-desirable location such as within a containment, the containment must be breached, which is problematic in the best of cases and potentially dangerous when processing dangerous materials or high-voltage circuitry. For small devices or constricted circuitry in a larger device, e.g., small sensors or testing devices, tools, small explosive devices, etc., it may be impossible to accurately detect the presence of an electric field of interest, as it is simply not possible to locate the sensor within the device such that it is at a detectable field strength.

What is needed in the art are methods and systems that can detect a weak electric field, and in one particular embodiment, can detect a weak static electric field. Such methods and systems can be used to detect an electric field at a greater distance from the source as compared to previously known detection devices and can provide benefit to the art.

SUMMARY

According to one embodiment, disclosed is a method for determining the presence of an electric field. A method can include locating a gaseous sample in an area. The gaseous sample can include a component (i.e., an atom or a molecule) that can exhibit a response to dielectrophoretic (DEP) forces. In one embodiment, the component can be polarizable, and a DEP force can induce a dipole moment in the component (i.e., polarize the component). A method can also include transmitting an input signal through the gaseous sample, the input signal including an electromagnetic wave having a wavelength from X-ray to Infrared (IR), and analyzing a response signal that is generated upon interaction of the electromagnetic wave with the component. The analysis (e.g., Raman analysis) can provide information regarding the presence of DEP forces acting on the component, e.g., polarization or local concentration gradient, which can, in turn, identify the presence of an electric field in the area.

Also disclosed are systems for use in determining the presence of an electric field. For instance, a system can include a container configured to enclose a gaseous sample, the gaseous sample including a component that can exhibit a response to DEP forces. The system also includes a sensor that includes a signal emitter (e.g., a laser), a signal detector, and a response signal analyzer (e.g., a spectroscope). The system can be configured such that the signal emitter can deliver an input signal through the gaseous sample and such that the signal detector can collect a response signal that is generated upon interaction of the input signal with the component and communicate that response to the response signal analyzer. In some embodiments, the system can optionally include a cooling jacket to cool the gaseous sample and/or an injector for injecting the gaseous sample into the container.

BRIEF DESCRIPTION OF THE FIGURES

A full and enabling disclosure of the present subject matter, including the best mode thereof to one of ordinary skill in the art, is set forth more particularly in the remainder of the specification, including reference to the accompanying figures in which.

Figure 1:
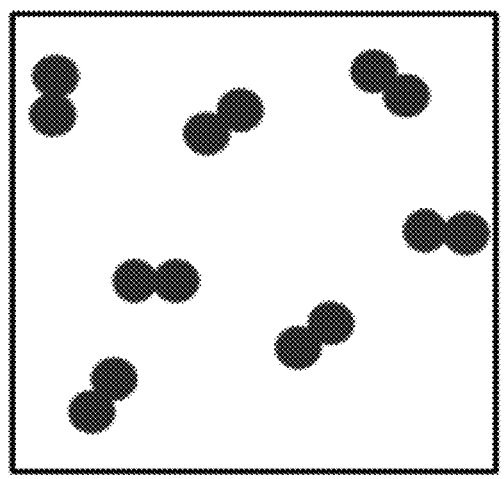
FIG. 1 schematically illustrates components of a gaseous sample in which the gaseous sample is not in the presence of an electric field. The illustrated components can exhibit a response to DEP forces.

Repeat use of reference characters in the present specification and drawings is intended to represent the same or analogous features or elements of the present invention.

DETAILED DESCRIPTION

Reference will now be made in detail to various embodiments of the disclosed subject matter, one or more examples of which are set forth below. Each embodiment is provided by way of explanation of the subject matter, not limitation thereof. In fact, it will be apparent to those skilled in the art that various modifications and variations may be made in the present disclosure without departing from the scope or spirit of the subject matter. For instance, features illustrated or described as part of one embodiment may be used in another embodiment to yield a still further embodiment.

The present disclosure is generally directed to methods and systems that can be utilized to determine the presence of an electric field. In some embodiments, the methods and systems can be utilized to determine one or more additional characteristics of an electric field such as field type (e.g., static or alternating), strength, direction, etc.

Beneficially, disclosed methods and systems can identify the presence of an electric field at a low field strength. This capability not only allows for the identification of very weak electric fields, but also allows for the identification of electric fields at a greater distance from the field source as compared to previously known electric field detectors. For example, previously known electric field detection systems required locating the sensor within a few millimeters of the strongest field strength. In contrast, disclosed systems can identify the presence of an electric field at a much greater distance, for instance about 6 inches or greater, or about a foot or greater in some embodiments. This can be of great benefit in many applications as it can allow for electric field detection at increased distances between a worker and a potentially dangerous area. In some embodiments, this can allow for electric field detection without the need to breach a containment area. Moreover, in some embodiments, electric field detection can be carried out using disclosed systems without the need to closely approach potentially dangerous materials and/or electric fields (e.g., explosive devices), which can decrease or eliminate safety issues surrounding the detection of electric fields.

While much of the following discussion concerns the detection of the presence of static electric fields, it should be understood that this disclosure is in no way intended to be limited to the detection of static electric fields, and the methods and systems can be utilized in some embodiments to detect the presence of alternating electric fields.

Disclosed methods and systems utilize DEP forces and the perturbation effect DEP forces can have on components in a gas to identify the presence of an electric field. As utilized herein, the term dielectrophoresis and dielectrophoretic forces, alternatively presented as DEP forces herein, refer to the phenomenon in which a force is exerted on a gaseous component (i.e., an atom or molecule in the gas state) when it is subjected to an electric field gradient. The component can be either polar or polarizable and the phenomenon does not require the component to be charged.

Figure 2:
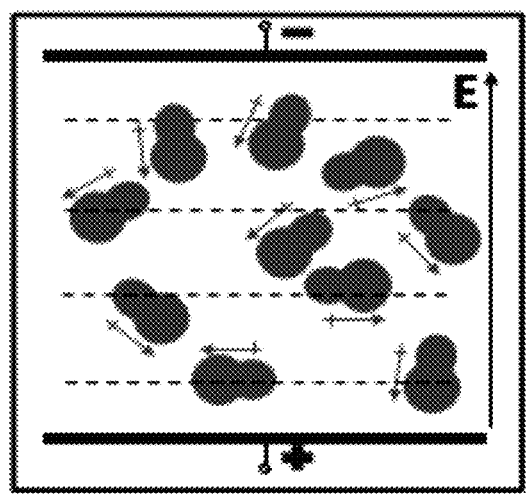
FIG. 2 schematically illustrates the components of the gaseous sample of FIG. 1 in the presence of an electric field.
Figure 3:
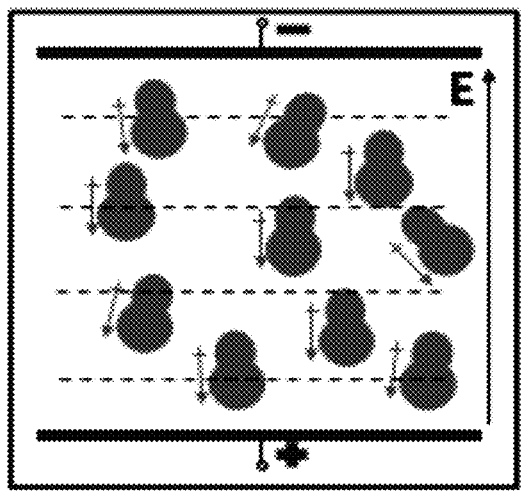
FIG. 3 schematically illustrates the gaseous sample of FIG. 2 as the temperature of the sample approaches absolute zero.

FIG. 1-FIG. 3 schematically illustrate DEP forces used in disclosed methods and systems for identification of the presence of an electric field. As indicated, when a gaseous sample is not within an electric field (FIG. 1), the gaseous components randomly dispersed with no alignment due to molecular polarization or global polarization. As utilized herein, the term "molecular polarization" refers to a submolecular distortion causing a separation of charge on a molecule when placed in an electric field. As utilized herein, the term "global polarization" refers to a non-random alignment (either slight or significant) of a plurality of gaseous components. As indicated in FIG. 2, when placed in an electric field (E), the components (molecules in this particular embodiment) can be polar or polarizable (as indicated by the arrows adjacent each molecule) and DEP forces exerted on the component can cause a slight alignment of the individual molecules with the field (global polarization) due to the polarity of the field as well as due to molecule-molecule interactions, with the more positively charged ends of the molecules aligned toward the negative pole of the electric field and the more negatively charged ends of the molecules aligned toward the positive pole of the electric field. These phenomena will be increasingly evident at lower temperature, as the DEP forces will become stronger as compared to other forces of the components (e.g., Brownian motion, etc.). Thus, and as indicated in FIG. 3, as the temperature of the gaseous sample approaches absolute zero, the alignment of the particles with the electric field will increase.

Disclosed methods and systems utilize a gaseous sample that includes a component that exhibits a recognizable response to DEP forces in an electric field in conjunction with a sensor that can detect that response. This recognizable response can include an alignment of the component due to the DEP forces. In some embodiments, the recognizable response can include the development of a higher concentration of the component within the field, and the sensor can detect this increased concentration.

In one embodiment, the component of the gaseous sample that exhibits a recognizable response to DEP forces can be a Raman-active material and the sensor can utilize Raman spectroscopy analysis to identify a recognizable Raman scattering response of the component to the DEP forces.

As utilized herein, the term "Raman scattering" refers to the physical phenomenon of inelastic scattering of monochromatic light, for instance from a laser source. Interaction of an input photon from the source with a component in a sample results in a response photon having a different energy, and therefore, a different wavelength as compared to the input photon. This energy difference corresponds to a vibrational state of the component and can result in an energy gain or loss to the response photon as compared to the input photon, depending on the original vibrational state of the component. A loss of energy causes a shift to a longer wavelength (referred to as a "Stokes" shift), while a gain of energy causes a shift to a shorter wavelength (referred to as an "anti-Stokes" shift). Raman scattering from a given material will produce a Stokes or anti-Stokes wavelength shift having a particular energy and this shift can vary in a known fashion depending upon the polarization state of the material. Detection of this wavelength shift can thus be used to identify the polarization state of components of the gaseous sample, and therefore, can be used to identify the presence of DEP forces acting upon the components.

As utilized herein, the term "Raman spectroscopy" refers to the spectral analysis of light scattered at a particular location, and "Raman imaging" refers to the detection of photons resulting from Raman scattering at a plurality of points in a two- or three-dimensional field that may be used to form an image indicative of the relative location of Raman-active materials within the field. One skilled in the art will readily understand that the expression "Raman investigation" can refer to Raman spectroscopy, Raman imaging, or any other technique which involves relying on Raman scattering to obtain information from a material or system containing the material.

In the presently disclosed methods and systems, variation from the typical Raman intensity and/or depolarization ratio of a Raman-active component due to an induced polarization of the component at the time of Raman investigation can provide information with regard to the presence of an electric field acting upon the component. As utilized herein, the term "depolarization ratio" refers to the intensity ratio between the perpendicular component and the parallel component of Raman scattered light.

Any of a large number of Raman-active components can be incorporated in a system, provided the components can be present in a gaseous sample at the desired temperature of operation of the system. A preferred Raman-active component of a particular system can vary depending on the desired operation temperature, the input signal wavelength of the system, the expected strength and type of the electrical field, etc. Those skilled in the art will be able to identify and select an appropriate component for a system based upon such parameters. Moreover, in some embodiments, a system can incorporate multiple different Raman-active components that can differ from one another, each having its own characteristic Raman response and characteristic shift in the presence of an electric field and induced polarization. Incorporation of multiple different Raman-active components in a system can provide for, e.g., utilization with different input wavelengths, recognizable response of the system over a broader range of electrical field strengths, etc.

Examples of Raman-active components as may be incorporated in a system include, without limitation, deuterium, methane, deutero-methane, carbon dioxide, iodine vapor, benzene, nitrobenzene, toluene, 1-bromonaphthalene, pyridine, cyclohexane, deuterated benzene, carbon disulfide, carbon tetrachloride, and chloroform. In one embodiment, a gaseous sample can include a molecule containing a Raman-active bond including, but not limited to, S—S, C—I, C—Br, C—SH, C—S, H—H, C—H, and C—C. Table 1 presents Raman shifts and Raman linewidths of some exemplary compounds or bonds of suitable compounds encompassed herein, though Raman-active materials as may be incorporated in a system are not limited to those of Table 1 and other components that may exist and/or may be shown to have suitable properties for the invention are encompassed herein.

TABLE 1

| Molecule or bond | Raman Shift ($cm^{-1}$) | Linewidth ($cm^{-1}$) |
|---|---|---|
| Hydrogen | 4155 | 0.0083 at 2.5 atm |
| Deuterium | 2991 | <1 |
| Methane | 291.5 | ~1 |
| Deutero-methane | 2084.7 | ~1 |
| Iodine gas | Various | ~0.03 |
| Benzene | 992 | 1.8 |
| Nitrobenzene | 1344 | 6.9 |
| Toluene | 1004 | 1.5 |
| 1-bromonaphthalene | 1368 | — |
| Pyridine | 992 | — |
| Cyclohexane | 2852 | — |
| Deuterated benzene | 944 | — |
| Carbon disulfide | 656 | — |
| Carbon tetrachloride | 459 | 5 |
| Chloroform | 668 | 8 |
| S—S | 445-550 | — |
| C—I | 490-522 | — |
| C—Br | 510-594 | — |
| C—Cl | 570-650 | — |
| C—SH | 600-700 | — |
| C—S | 630-705 | — |
| C—C | 700-1100 | — |

Disclosed systems are not limited to Raman-active components and Raman spectroscopy, however, and other components that can exhibit a recognizable response under DEP forces are encompassed herein, as well as other detection methods. By way of example, in one embodiment, an optical sensor can be utilized in which a change in optical polarization between the input signal and the response signal can indicate polarization of a component of the sample, i.e., increased alignment of the individual components with one another, the polarization indicating the result of DEP forces on the component.

In yet another embodiment, the DEP forces can lead to the development of a concentration gradient of the effected component in the gaseous sample, and the detection system can recognize this concentration gradient. Examples of detection techniques for such an embodiment can include, without limitation, Fourier-transform infrared spectroscopy (FTIR), ultraviolet/visible (UV/vis) spectrophotometry, or imaging versions of optical techniques, e.g., imaging IR, can be placed at varying distances in a gas cell or rastered along a gas cell in determination of a concentration gradient.

Figure 4:
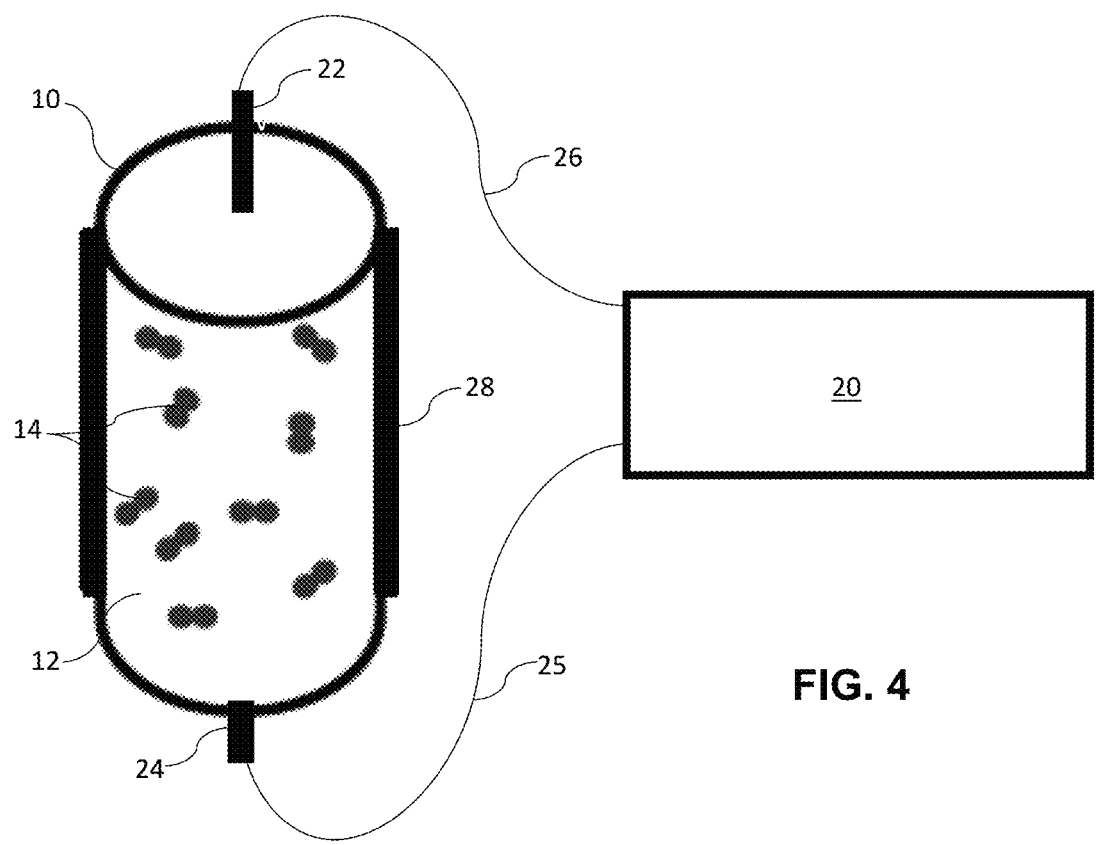
FIG. 4 schematically illustrates one embodiment of an electric field detection system as disclosed herein.

FIG. 4 illustrates one embodiment of an electric field detection system. As indicated, a system can include a container 10 configured to carry a gaseous sample 12 that, in turn, includes a component 14 that can exhibit a response to DEP forces. While the entire gaseous sample 12 can consist exclusively of the component 14, this is not a requirement of the systems, and the gaseous sample 12 can include multiple different components including, but not limited to, multiple components that exhibit a response to DEP forces, with the response varying among the components, and the different response can be identifiable by the system.

In one embodiment, the gaseous sample 12 can include or be combined with an enhancer component that can enhance the response signal of a sensor. For example, in those embodiments in which the sensor utilizes Raman spectroscopy in identification of an electric field, the gaseous sample 12 can include or be combined with nanoparticles that can enhance the Raman spectroscopy-based sensing process.

Nanoparticles as may enhance a Raman identification system can generally be about 25 nanometers (nm) to about 200 nm in size. In some embodiments, smaller nanoparticles can be utilized as smaller particles may remain distributed throughout the gaseous sample for a longer period of time as compared to larger nanoparticles. When included in a system, nanoparticles may be variously shaped. For example, the nanoparticles can be spherical or cylindrical in some embodiments.

When included in a system, nanoparticles may be formed of any material that can enhance the Raman scattering signal. In addition, all of the nanoparticles can be identical to one another. Alternatively, a nanoparticle enhancer component can include nanoparticles formed of different materials from one another and/or different shapes from one another. A nanoparticle enhancer component can include, without limitation, gold or silver nanoparticles. In some embodiments, a portion of the nanoparticles may be made of gold, while others may be made of silver. In one embodiment, core/shell nanoparticles can be utilized that include a shell of gold formed on a core silver particle, or vice versa. In some embodiments, the nanoparticles may be coated with a thin protective layer, such as silica.

The inclusion of nanoparticles in the gaseous sample 12 may increase enhancement factors of the detection process. Without wishing to be bound to any particular theory, this enhancement is believed to result from localized surface plasmon coupling between nanoparticles and an enhanced electromagnetic field intensity localized at the nanoparticle surface.

When utilized, nanoparticles can be distributed throughout the gaseous sample during a sensing protocol. A distribution of nanoparticles in the gaseous sample can be ensured in one embodiment by stirring a container 10 that has been previously filled with the gaseous sample and the nanoparticles immediately prior to carrying out a sensing protocol. In another embodiment, the nanoparticles can be combined with the gaseous sample at the time of sensing. For instance, the nanoparticles can be injected into the gaseous sample or injected into an area in conjunction with the gaseous sample prior to utilizing the system to detect an electric field The pressure of the gaseous sample is not particularly limited, it only requires suitable concentration of the component of interest such that the sensor can detect the response of the component to DEP forces. For instance, in some embodiments, the gaseous sample 12 can be retained in the container 10 at atmospheric pressure. In other embodiments, the gaseous sample 12 can be retained at increased pressure.

In conjunction with a gaseous sample 12, a system can also include a sensor 20 configured to detect a recognizable response of the component 14 to DEP forces. In general, a sensor can include a signal emitter 22 and a signal detector 24. The signal emitter 22 and the signal detector 24 can be placed in communication with the gaseous sample 12 held in the container 10.

The signal emitter 22 can be configured to deliver an input signal through the gaseous sample 12. In one embodiment, the input signal can be generated by a signal source, e.g., a laser, that is in optical communication with the signal emitter, for instance via an optical fiber 26. In other embodiments, the signal emitter 22 can incorporate the signal source. In any case, the signal emitter 22 can be placed in suitable (e.g., optical) communication with the gas sample 12 so as to deliver an input signal through the gas sample.

An input signal delivered by the signal emitter 22 can include an electromagnetic wavelength that can interact with the component 14 of the gas sample to generate a detectable response. In general, the input signal can carry energy at a wavelength from x-ray (about 10 picometers) to IR (about 100 micrometers). For instance, the input signal can carry energy at a wavelength from ultraviolet (about 100 nm) to NIR (about 10 micrometers), or in the visible spectrum in some embodiments (about 380 nm to about 760 nm). In one embodiment, the input signal can carry a single wavelength, e.g., a monochromatic signal, but this is not a requirement of a system, and in other embodiments, an input signal can include energy at multiple different wavelengths.

A system can include a signal detector 24 that can be in suitable (e.g., optical) communication with the gaseous sample and other components of a sensor 20, e.g., a signal analyzer such as a spectroscope. A response signal generated from a component 14 in response to an input signal can be collected by the signal detector 24 and communicated to analysis components of the sensor 20, for instance via an optical fiber 25.

A central processing unit and/or other components of a sensor 20 can control generation and delivery of an input signal to a gaseous sample 12 via a signal emitter 22. The input signal can pass from the signal emitter 22 and into the gas sample 12, for instance by use of a window or the like in the container wall and can then travel through the gas sample 14. In the embodiment of FIG. 4, the signal detector 24 can collect the response signal of the component 14, which is generated upon interaction of the input signal with the component 14. For instance, the signal detector 24 can collect a Raman scattering signal arising from the interaction of the input signal with the component 14. The response signal collected by the signal collector 24 can then be communicated to analysis components of the sensor 20 and analyzed via, e.g., Raman spectroscopy. The analysis can provide information with regard to one or more of polarization of the component 14 and concentration gradient of the component 14, which can in turn provide information regarding the presence of DEP forces, and as such, the presence of an electric field.

Through the analysis, one or more of the types, direction, and strength of an electric field can also be determined in some embodiments. For instance, in those embodiments in which the response signal indicates DEP forces acting on the component 14 and the response signal is steady, a user can be informed that a static electric field is present. In contrast, if a response signal indicates that the DEP forces are shifting as a function of time, e.g., shifting polarity of polarization, a user can be informed that an alternating electric field is present.

Moreover, in those embodiments in which the analysis provides information with regard to the polarization of the component 14, the polarization direction can provide information with regard to the direction of polarity of the electric field.

In one embodiment, disclosed systems can be utilized to determine the strength of an electric field. For instance, the strength of the electric field can be determined from predetermined calibration data regarding the variation in the recognizable response of the component 14, e.g., the shift in Raman intensity, the shift in Raman depolarization ratio, etc., in electric fields of known strengths.

In conjunction with a signal emitter 22, a signal detector 24 and analysis components (e.g., a Raman spectroscopy device), a sensor 20 can include additional components as are generally known in the art, such as optical fibers, optical filters, photomultipliers, input/output systems, control systems, etc., according to standard practice.

Referring again to FIG. 4, in one embodiment, a sensor 20 can include a cooling device, e.g., a cooling jacket 28, that can lower the temperature of the gaseous sample 12 which can increase the response of the component 14 to DEP forces of a non-uniform electric field. Any cooling device as is generally known in the art can be utilized to decrease the temperature of the gaseous sample 12. For instance, a cooling jacket 28 can generally include one or more flow fields through which a coolant, that can be either a liquid or a gas coolant, can flow. During use, the coolant can pass near a surface of the container 10, where heat transfer between the coolant and the container 10 can occur, thereby cooling the gaseous sample. Exemplary coolants can include, without limitation, water, carbon dioxide, oxygen, nitrogen, etc., as well as piezoelectric coolers as are generally known.

Figure 5:
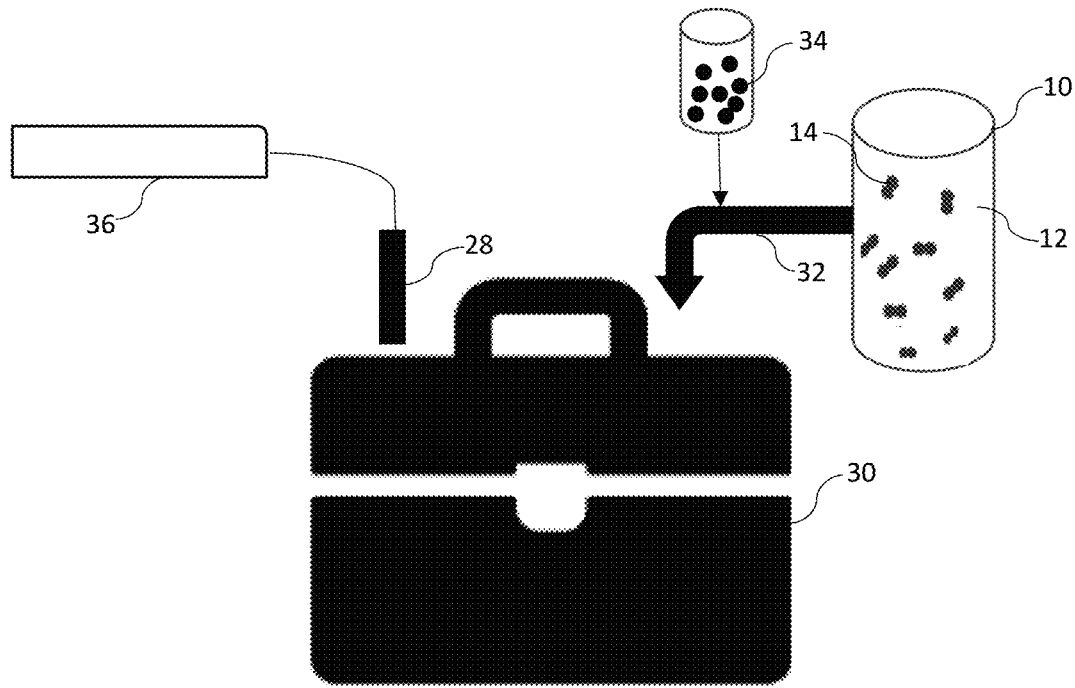
FIG. 5 schematically illustrates another embodiment of an electric field detection system as disclosed herein.

FIG. 5 illustrates another embodiment of a sensing system. In this embodiment, the container 10 carrying the gaseous sample 12, including the component 14, can be configured to deliver the gaseous sample 12 to another area for determination of the presence of an electric field in that area. For instance, such a system may be useful in those embodiments in which the area of interest is relatively non-accessible and/or the electric field of the area may be very small, e.g., the internal area of a container 30. In one embodiment, such a system can be utilized to detect an electric field within a container 30 that is suspected of carrying an explosive device such as a nuclear device or an improvised explosive device (IED). In such an embodiment, a sensing system can include an injector 32 or the like configured to deliver the gaseous sample 12 to an area of interest.

To enhance the response signal of the component 14, in one embodiment an enhancer component 34 such as a plurality of nanoparticles as discussed previously, can be injected to the area in conjunction with the gaseous sample. The enhancer component 34 can be configured to remain distributed throughout the gaseous sample for a period of time during which the sensing system can be utilized to detect the presence of an electric field.

Following injection of the gaseous sample 12 and any enhancer component 34 to the area, a sensor 36, e.g., a Raman spectroscopy-based sensor, can then be utilized to deliver an input signal to the area and collect a response signal from the area.

As illustrated in FIG. 5, the sensor can include a single imaging probe 28 or, in other embodiments, a sensor can include multiple imaging probes. In such an embodiment, a probe 28 can carry both a signal emitter and a signal detector. The signal detector of the probe 28 can collect the response signal (e.g., the Raman scattering signal) in a backscattering mode and the signal detector can be arranged 180° from the direction of travel of an input signal delivered from the signal emitter of the probe 28. This arrangement may ensure that the field of view of the signal detector overlaps with the gaseous volume contacted with the input signal. During use, the input signal may pass through the gaseous sample and the response signal can scatter and be collected at the signal detector of the probe 28. A probe 28 can be relatively small in some embodiments, for instance having a cross-sectional size, e.g., diameter, of about 1 inch or less, such as from about 0.25 to about 0.5 inches, and a length of about 6 inches or less, such as from about 2 to about 5 inches, or from about 3 to about 4 inches.

The use of a single imaging probe 28, as in the embodiment of FIG. 5 or a separable signal emitter 22 and signal detector 24 as in the embodiment of FIG. 4, is not limited to any particular embodiment. For instance, a system that utilizes an injectable gaseous sample is not limited to the use of a sensor with a single imaging probe, and a system that utilizes the contained gaseous sample without injection to a sensing area is not limited to separable signal emitters and detectors. Likewise, the systems are not limited to the use of a single emitter and a single detector. In some embodiments, it may be beneficial to utilize a plurality of signal detectors so as to collect the response signals at multiple locations.

The imaging probe 28 can be placed in optical communication with the area to which the gaseous sample has been delivered in order to emit an input signal and collect a response signal for analysis. In one embodiment, an imaging probe 28 can be inserted into the area of a container 30 via the injection port utilized to inject the gaseous sample 12. In another embodiment, an access can be formed in the wall of the container 30 that can provide for optical communication between the imaging probe 28 and the gaseous sample. Upon analysis of a response signal obtained by the imaging probe 28, information regarding the action of DEP forces on the component of the gas sample can be obtained which, in turn, can provide information regarding the presence of an electric field in the area that is within the container 30.

The present invention may be better understood with reference to the Example, set forth below.

Example

Figure 6:
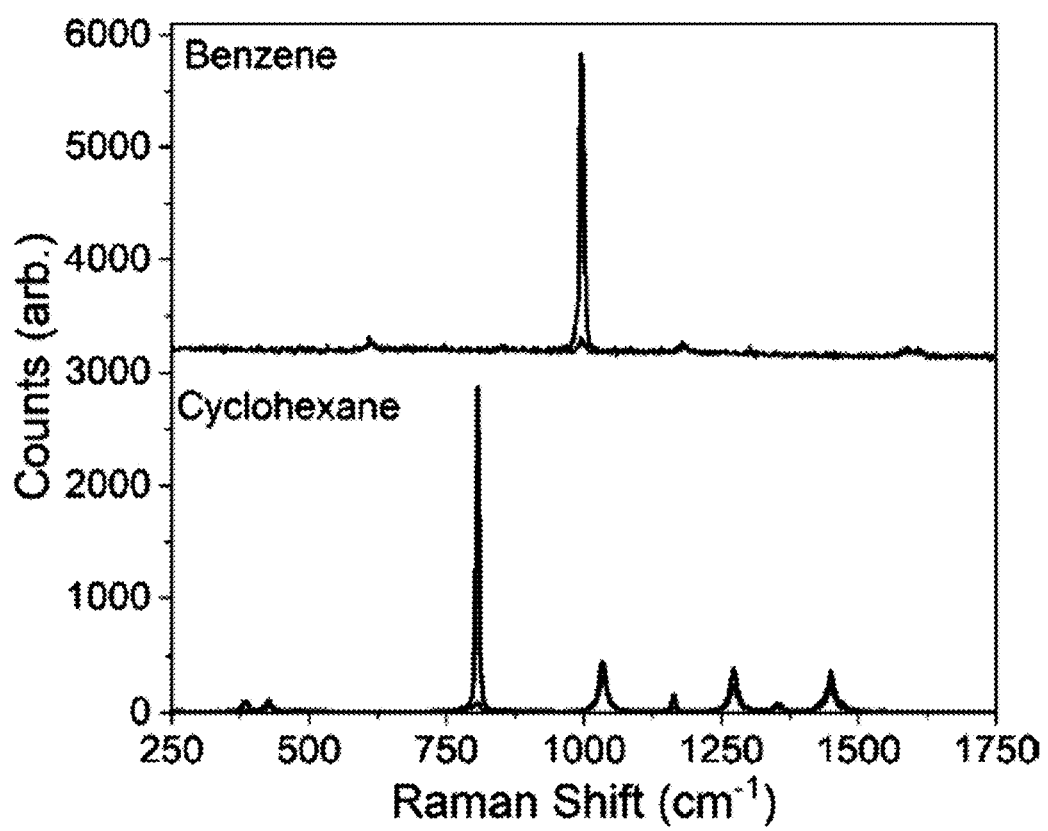
FIG. 6 graphically presents Raman spectra for liquid phase benzene and cyclohexene with and without an electric field.

A gas cell capable of generating electric field up to $10^5$ V/cm was constructed, and Raman spectra of liquid benzene and cyclohexane in the cell both with and without an applied static field. Results are shown in FIG. 6. In the Figure, the large peaks were obtained when the detected Raman scattering was polarized parallel to the polarization of the laser. The Raman spectra of both liquids showed large changes upon polarization. As indicated, benzene contains a polarized band at 996 cm$^{-1}$ and cyclohexane contains polarized bands at 385, 807, and 1164 cm$^{-1}$.

Figure 7:
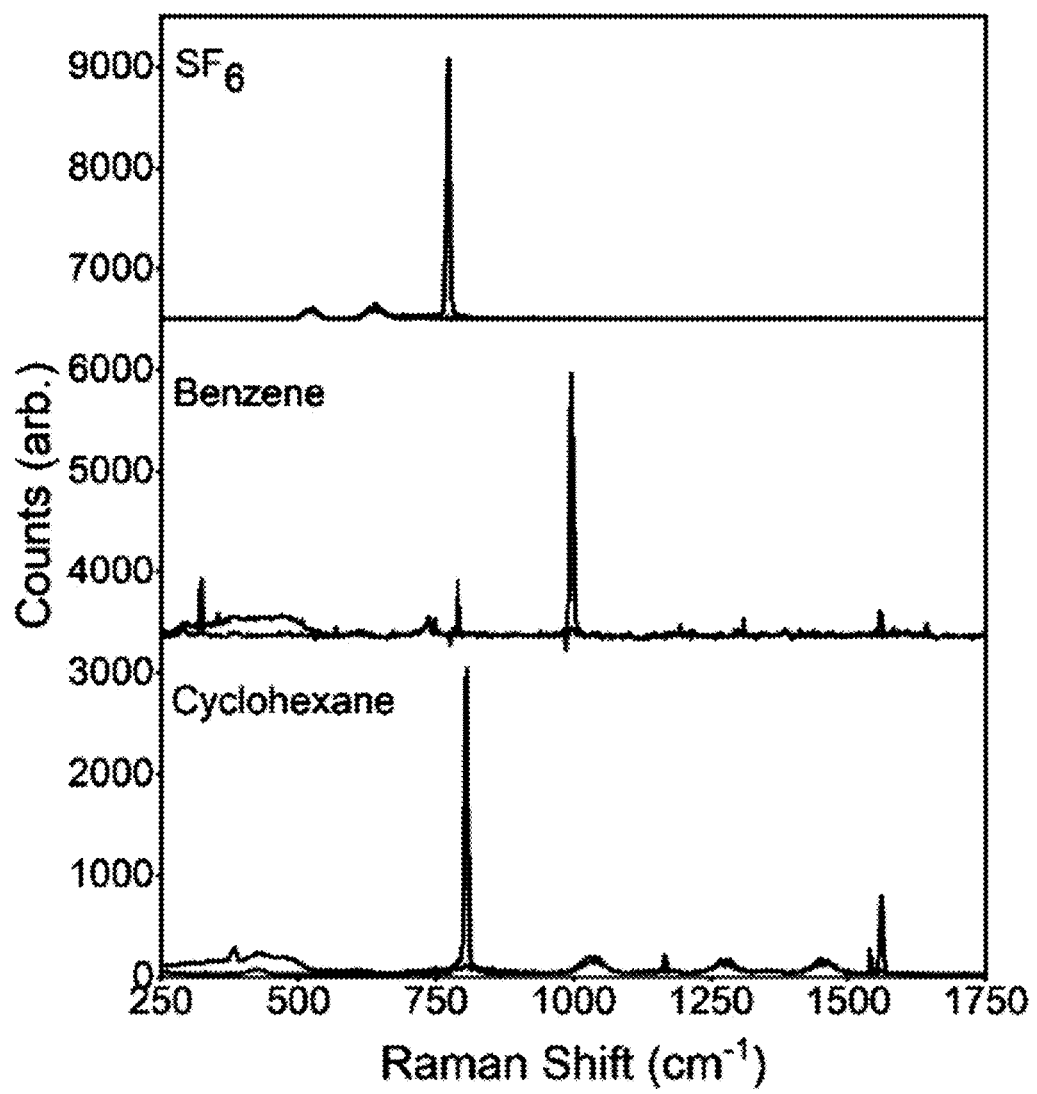
FIG. 7 graphically presents Raman spectra for gaseous benzene and cyclohexane and sulfur hexafluoride ($SF_6$).

The gas cell was also utilized to obtain the Raman spectra for $SF_6$ as well as gaseous benzene and cyclohexane. Results are shown in FIG. 7. In the Figure, the large peaks were obtained with the detected Raman scattering was polarized parallel to the polarization of the laser. As indicated, all examined materials showed large changes in their polarization. The spectra for gaseous benzene and cyclohexane were in agreement with the liquid phase, and the $SF_6$ exhibited a polarized band at 773 cm$^{-1}$.

While certain embodiments of the disclosed subject matter have been described using specific terms, such description is for illustrative purposes only, and it is to be understood that changes and variations may be made without departing from the spirit or scope of the subject matter.

What is claimed is:

1. A method for identifying an electric field, comprising:
    locating a gaseous sample in an area, the gaseous sample comprising a component that exhibits a response to a dielectrophoretic force;
    transmitting an input signal through the gaseous sample, the input signal including an electromagnetic wave having a wavelength from about 10 picometers to about 100 micrometers; and
    analyzing a response signal that is generated upon interaction of the electromagnetic wave with the component, the analysis providing information regarding the presence of dielectrophoretic forces acting on the component, and thereby identifying a static electric field in the area.

2. The method of claim 1, wherein the component is a polarizable component.

3. The method of claim 1, wherein the component is a Raman-active material.

4. The method of claim 1, the input signal comprising an electromagnetic wave having a wavelength from about 100 nanometers to about 10 micrometers.

5. The method of claim 1, the analysis comprising Raman spectroscopy.

6. The method of claim 5, the analysis comprising determination of one or both of the Raman intensity and the depolarization ratio of the response signal.

7. The method of claim 1, the information comprising one or more of polarization of the component, and concentration gradient of the component.

8. The method of claim 1, wherein the gaseous sample is held in a container, the method comprising locating the container in the area.

9. The method of claim 8, wherein the area is adjacent a containment area.

10. The method of claim 1, the method further comprising delivering the gaseous sample to the area.

11. The method of claim 1, wherein the input signal is transmitted from a source, the method including locating the source at a distance of about 6 inches or greater from the gaseous sample.

12. A system for identifying an electric field, the system comprising:
    a container;
    a gaseous sample retained in the container, the gaseous sample comprising a component that exhibits a response to dielectrophoretic forces;
    a sensor, the sensor comprising a signal emitter, a signal detector, and a response signal analyzer; wherein
    the signal emitter is configured to be locatable in communication with the gaseous sample and thereby deliver an input signal through the gaseous sample;
    the signal detector is configured to be locatable in communication with the gaseous sample and thereby collect the response signal that is generated upon interaction of the input signal with the component and thereafter to deliver the response signal to the response signal analyzer; and the response signal analyzer is configured to identify a static electric field within the container.

13. The system of claim 12, further comprising a cooling jacket configured for cooling the gaseous sample retained in the container.

14. The system of claim 12, further comprising an injector configured for injecting the gaseous sample from the container to an area.

15. The system of claim 12, wherein the sensor comprises a Raman spectroscopy-based sensor.

16. The system of claim 12, wherein the signal emitter comprises a laser.

17. The system of claim 12, wherein the component comprises deuterium, methane, deutero-methane, carbon dioxide, iodine vapor, benzene, nitrobenzene, toluene, 1-bromonaphthalene, pyridine, cyclohexane, deuterated benzene, carbon disulfide, carbon tetrachloride, or chloroform.

18. The system of claim 12, wherein the component comprises a bond selected from the group consisting of S—S, C—I, C—Br, C—SH, C—S, H—H, C—H, and C—C.

19. The system of claim 12, wherein the input signal comprises an electromagnetic wave having a wavelength from about 10 picometers to about 100 micrometers.

* * * * *